(12) United States Patent
Chuang et al.

(10) Patent No.: US 10,332,882 B2
(45) Date of Patent: Jun. 25, 2019

(54) SEMICONDUCTOR DEVICE HAVING PROTECTIVE STRUCTURE OVER SHALLOW TRENCH ISOLATION REGION AND FABRICATING METHOD THEREOF

(71) Applicant: TAIWAN SEMICONDUCTOR MANUFACTURING CO., LTD., Hsinchu (TW)

(72) Inventors: Harry Hak-Lay Chuang, Singapore (SG); Wei-Cheng Wu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 18 days.

(21) Appl. No.: 14/144,356

(22) Filed: Dec. 30, 2013

(65) Prior Publication Data

US 2015/0187783 A1    Jul. 2, 2015

(51) Int. Cl.
*H01L 27/092* (2006.01)
*H01L 21/28* (2006.01)
(Continued)

(52) U.S. Cl.
CPC ...... *H01L 27/092* (2013.01); *H01L 21/28273* (2013.01); *H01L 21/28282* (2013.01); *H01L 27/11531* (2013.01); *H01L 27/11573* (2013.01); *H01L 29/42328* (2013.01); *H01L 29/42344* (2013.01); *H01L 21/823437* (2013.01);
(Continued)

(58) Field of Classification Search
CPC ........... H01L 27/0629; H01L 27/11568; H01L 27/10894; H01L 23/5256; H01L 27/10897; H01L 27/11521; H01L 27/11573; H01L 29/792; H01L 21/28282; H01L 27/115; H01L 27/11526; H01L 29/42344; H01L 21/823437; H01L 27/1052; H01L 29/66545; H01L 27/11531; H01L 27/11575
USPC .............. 257/314, 316, 368, 529, E21.679, 257/E27.081
See application file for complete search history.

(56) References Cited

U.S. PATENT DOCUMENTS 6,110,800 A * 8/2000 Chou ................ H01L 21/76224
257/E21.546
2003/0057505 A1* 3/2003 Ebina .................... H01L 27/105
257/411

(Continued)

FOREIGN PATENT DOCUMENTS

CN            103311397 A        9/2013

*Primary Examiner* — David Chen
(74) *Attorney, Agent, or Firm* — McDermott Will & Emery LLP

(57) ABSTRACT

A semiconductor device and a method for fabricating the semiconductor device are provided in the present disclosure. The semiconductor device includes a substrate including a first active region and a second active region divided by a shallow trench isolation (STI) region, a protective structure located on the STI region, a first semiconductor structure on the first active region, and a second semiconductor structure on the second active region of the substrate including a high-k dielectric layer and a metal gate layer over the high-k dielectric layer. The method for fabricating the semiconductor device is a process of the high-k dielectric layer deposited before the formation of the first and second semiconductor structures.

20 Claims, 17 Drawing Sheets

(51) Int. Cl.
    *H01L 27/11573*     (2017.01)
    *H01L 29/423*     (2006.01)
    *H01L 27/11531*     (2017.01)
    *H01L 27/06*     (2006.01)
    *H01L 27/108*     (2006.01)
    *H01L 27/11575*     (2017.01)
    *H01L 27/11568*     (2017.01)
    *H01L 29/792*     (2006.01)
    *H01L 27/11526*     (2017.01)
    *H01L 29/66*     (2006.01)
    *H01L 27/11521*     (2017.01)
    *H01L 27/105*     (2006.01)
    *H01L 23/525*     (2006.01)
    *H01L 21/8234*     (2006.01)

(52) U.S. Cl.
    CPC ...... *H01L 23/5256* (2013.01); *H01L 27/0629* (2013.01); *H01L 27/1052* (2013.01); *H01L 27/10894* (2013.01); *H01L 27/10897* (2013.01); *H01L 27/11521* (2013.01); *H01L 27/11526* (2013.01); *H01L 27/11568* (2013.01); *H01L 27/11575* (2013.01); *H01L 29/66545* (2013.01); *H01L 29/792* (2013.01)

(56) References Cited

U.S. PATENT DOCUMENTS

| | | | |
|---|---|---|---|
| 2006/0022281 A1* | 2/2006 | Yamazaki | H01L 21/82341 257/392 |
| 2007/0207575 A1* | 9/2007 | Taniguchi | H01L 21/82346 438/199 |
| 2010/0255647 A1* | 10/2010 | Yamakoshi | H01L 27/11546 438/211 |
| 2011/0095348 A1* | 4/2011 | Chakihara et al. | 257/298 |
| 2011/0110156 A1* | 5/2011 | Kawashima | H01L 21/28282 365/185.08 |
| 2011/0235408 A1* | 9/2011 | Minemura | H01L 27/2409 365/163 |
| 2012/0068243 A1* | 3/2012 | Kawashima | H01L 27/11573 257/315 |
| 2012/0299084 A1* | 11/2012 | Saito | H01L 21/28282 257/324 |
| 2013/0084684 A1* | 4/2013 | Ishii | H01L 21/28282 438/257 |
| 2014/0065776 A1* | 3/2014 | Mihara | G11C 11/5671 438/239 |

* cited by examiner

US 10,332,882 B2

SEMICONDUCTOR DEVICE HAVING PROTECTIVE STRUCTURE OVER SHALLOW TRENCH ISOLATION REGION AND FABRICATING METHOD THEREOF

BACKGROUND

Semiconductor devices with various functions, such as memory, transistor, and capacitor, may be embedded in the same integrated circuit (IC). As such, the fabricating processes for the different semiconductor devices with different material need to be designed and integrated all together.

A memory device is commonly embedded in a system on chip (SOC) integrated circuits having peripheral circuits like complementary metal oxide semiconductor (CMOS) logic circuits. Generally, there are volatile memory, such as dynamic random access memory (DRAM) and static random access memory (SRAM), or non-volatile memory (NVM), including read only memory (ROM) and flash memory, in a memory structure, as well as a logic circuit like p-type metal oxide semiconductor (PMOS), n-type metal oxide semiconductor (NMOS), and COMS. A non-volatile memory normally includes a stacked gate structure which has a floating gate and a control gate positioned directly above the floating gate, and a split gate cell structure which has the control gate positioned above but offset from the floating gate. The split-gate cell normally includes an additional gate known as a select gate which involves relatively complex manufacturing processing operations. In this regard, integrating the split gate memory cells on a SOC requires additional lithography steps which with more masks or reticules and higher cost.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
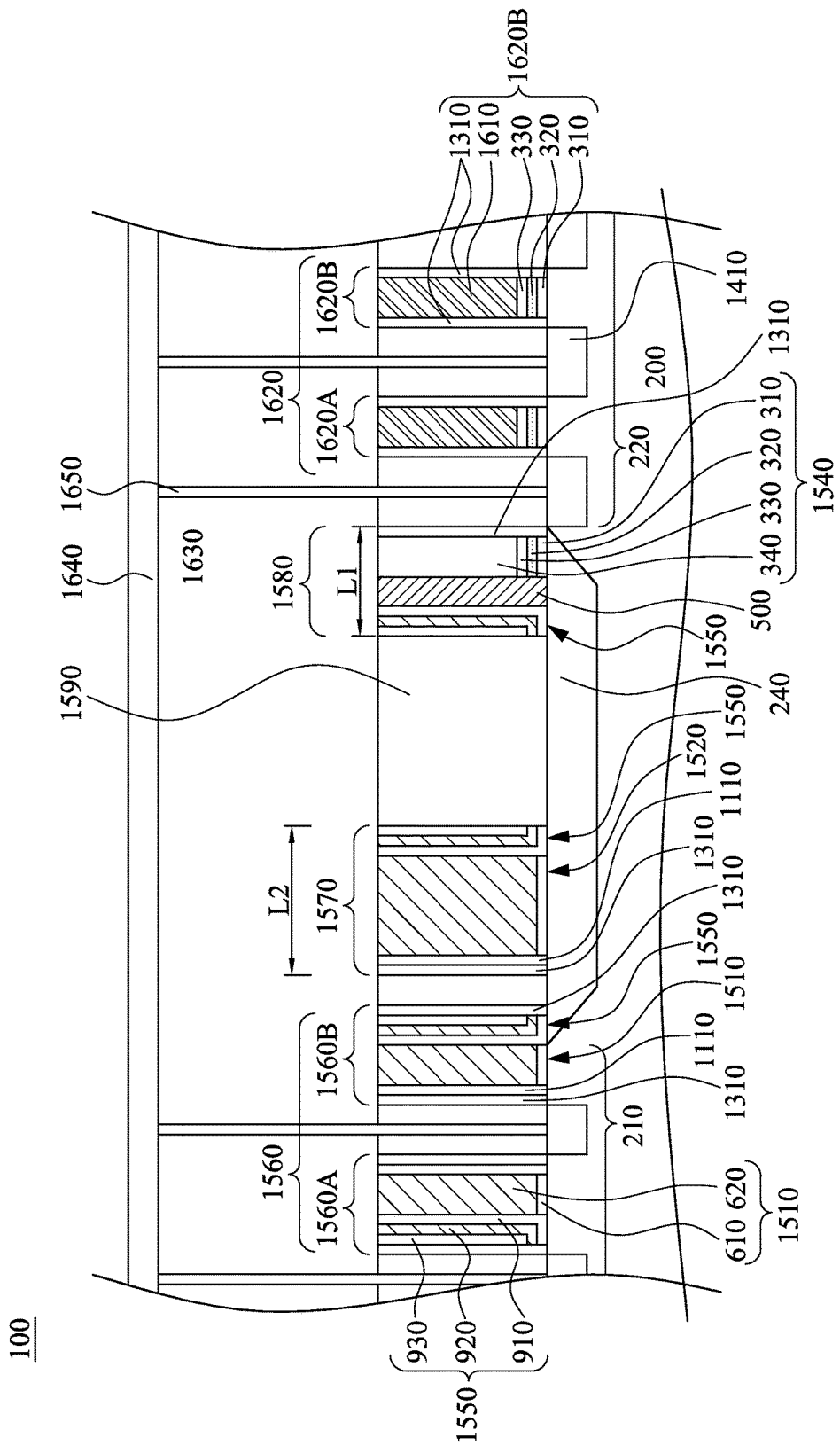
FIG. 1 is a cross-sectional view of a semiconductor device according to some embodiments of the present disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

As used herein, the terms "comprising," "including," "having," "containing," "involving," and the like are to be understood to be open-ended, i.e., to mean including but not limited to.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Many research and development have been devoted into the process integration for different semiconductor devices. A semiconductor device fabricating process may include memory and logic devices, for example, NVM with polysilicon gate and CMOS with high-k dielectric layer and metal gate (HKMG), in which the memory device is formed prior to forming the logic device. The high-k dielectric layer in the logic device is deposited after the formation of the memory device. Therefore, the memory device needs to be covered in advance of forming the high-k dielectric layer. Afterwards, the covering layer and the high-k dielectric layer formed over the memory device need to be removed when the logic structure is formed. However, the above-mentioned process needs two additional masks in order to remove the layers to separate the memory device and logic device. First mask is used to etch the high-k dielectric layer residue between the logic device and memory device and separate the memory and logic devices, second mask to remove the covering layers to expose the memory device. Additional masks means additional time and cost, also brings contamination issue to the formed logic structures.

Therefore, according to various embodiments of the present disclosure, a method for fabricating a semiconductor device is provided, in which an operation of forming a high-k dielectric layer is conducted before forming the memory device in the method. In the method according to the embodiments of the present disclosure, no above mentioned two masks but one mask is needed; therefore, the contamination issues is able to be avoided. Further, mechanism for forming semiconductor devices is provided according to various embodiments of the present disclosure.

FIG. 1 is a cross-sectional view of a semiconductor device according to various embodiments of the present disclosure. The feature of the semiconductor device 100 is that there will have one protective structure 1580 between two active regions 210, 220 of different semiconductor structures. In various embodiments of the present disclosure, the semiconductor device 100 also includes a dummy structure 1570 neighboring the protective structure 1580. In various embodiments of the present disclosure, the semiconductor device 100 includes a substrate 200, a protective structure 1580, a memory device 1560, which includes 1560A and 1560B, and a logic device 1620, which includes 1620A and 1620B. The substrate 200 that has an active region 210 and an active region 220 divided by a shallow trench isolation (STI) region 240. The substrate 200 also includes various doped regions 1410 such as n-wells and p-wells. The protective structure 1580 formed over the STI region 240 at the boundary of the active region 220. The memory device 1560 is formed over the active region 210 of the substrate 200. The logic device 1620 is formed over the active region 220 of the substrate 200. The memory device 1560 and the logic device 1620 are devices formed as a part of the semiconductor device 100. For example, the semiconductor device 100 may include flash memory and/or other logic circuits, active devices as P-channel field effect transistors (PFET), N-channel FET (NFET), metal-oxide semiconductor field effect transistors (MOSFET), complementary metal-oxide semiconductor (CMOS) transistors, bipolar junction transistors (BJT), high voltage transistors, high frequency transistors, other memory cells, and passive components such as resistors, capacitors, and inductors, or combinations thereof. In various embodiments of the present disclosure, the semiconductor device 100 also includes a dummy structure 1570 disposed between the protective structure 1580 and the memory device 1560. The dummy structure 1570 formed over the STI region 240 neighboring the active region 210.

In various embodiments of the present disclosure, the memory device 1560 may include a volatile memory including DRAM, SRAM, or a non-volatile memory including ROM and flash memory, or combinations thereof, and the logic device 1620 may include a p-type metal oxide semiconductor (PMOS), a n-type metal oxide semiconductor (NMOS), a complementary metal-oxide-semiconductor (CMOS), or combinations thereof.

In various embodiments of the present disclosure, the memory device 1560 includes an intermediate layer 610 and a conductive layer 620 over the intermediate layer 610, in which the conductive layer 620 includes polysilicon. The logic device 1620 includes a high-k dielectric layer 320 and a metal gate layer 1610 over the high-k dielectric layer 320. In various embodiments of the present disclosure, the memory device 1560 is a thin film split-gate flash memory, and the logic device 1620 is a CMOS includes high-k dielectric layer and metal gate (HKMG) structure.

In various embodiments of the present disclosure, the protective structure 1580 is formed during the process for forming the high-k dielectric layer 320 before forming the memory device 1560 and logic device 1620 in an embedded system to separate the memory device 1560 and the logic device 1620 on different active regions 210, 220. The protective structure 1580 may protect the logic device 1620 during the fabrication process. In various embodiments of the present disclosure, the protective structure 1580 includes a dummy gate stack 1540 with the high-k dielectric layer 320 and the protective spacer 500 next to the dummy gate stack 1540. In various embodiments of the present disclosure, the protective structure 1580 further includes a storage structure 1550 next to the protective spacer 500, and a sidewall spacer 1310 next to the dummy gate stack 1540. The storage structure 1550 is formed in the same operation of forming the memory structure. The dummy gate stack 1540 includes an intermediate layer 310 over the substrate 200, the high-k dielectric layer 320 over the intermediate layer 310, an etch stop layer 330 over the high-k dielectric layer 320, and a conductive layer 340 over the etch stop layer 330. The storage structure 1550 includes a storage layer 910 having a L-shape over the substrate 200, a conductive layer 920 having a L-shape over the storage layer 910, and a protective layer 930 over the conductive layer 920. The storage layer 910 includes a nano dot storage layer and two oxide layers sandwiches the nano dot storage layer (in which the sandwich structure only represented as one storage layer in the figure). The protective spacer 500 next to the dummy gate stack 1540 is an useful structure in the fabricating process, the protective spacer 500 protects the structures formed over the active region 220 not to be contaminated during the formation of the memory device 1560, and also when forming the logic device 1620, the residues will not cross the protective spacer 500 to contaminate other devices. The length L1 of the protective structure is in a range from about 0.1 μm to about 0.4 μm.

In various embodiments of the present disclosure, the memory device 1560 includes a gate structure 1510, a storage structure 1550 next to the gate structure 1510, and a dielectric layer 1110 on the sidewall at the other side of the gate structure 1510, two sidewall spacers 1310 next to the storage structure 1550 and the dielectric layer 1110 separately. The gate structure 1510 includes the intermediate layer 610 over the substrate 200, and the conductive layer 620 over the intermediate layer 610.

In various embodiments of the present disclosure, the logic device 1620 includes the intermediate layer 310 over the substrate 200, the high-k dielectric layer 320 over the intermediate layer 310, an etch stop layer 330 over the high-k dielectric layer 320, the metal gate layer 1610 over the etch stop layer 330, and two sidewall spacers 1310 on the substrate 200 next to the metal gate layer 1610.

In various embodiments of the present disclosure, the memory device 1560 and logic device 1620 further include doped regions 1410 including lightly and heavily doped regions as source/drain regions. In various embodiments of the present disclosure, the semiconductor device 100 further includes an interlayer dielectric layer 1590 on the substrate 200 and between the memory device 1560, the logic device 1620, the dummy structure 1570 and the protective structure 1580. An interlayer dielectric layer 1630 overlies the interlayer dielectric layer 1590, the memory device 1560, the logic device 1620, the protective structures 1580 and the dummy structure 1570. A metal layer 1640 overlies the dielectric layer 1630. A plurality of contacts 1650 connects the doped regions 1410 and the metal layer 1640.

In various embodiments of the present disclosure, the dummy structure 1570 is formed next to the protective structure 1580 over the STI region 240. The dummy structure 1570 may help to define the boundary of the memory device 1560 and also act as a polishing stopper in a CMP process, to prevent the STI region 240 from over polishing. The dummy structure 1570 includes a dummy gate stack 1520, a dielectric layer 1110 at one side of the dummy gate stack 1520, a storage structure 1550 at the other side of the dummy gate stack 1520, and a sidewall spacer 1310 next to the dielectric layer 1110. The dummy gate stack 1520 includes an intermediate layer 610 and a conductive layer 620 over the intermediate layer 610. The dummy structure 1570 may be formed in the same operation that forms the memory device 1560 and the logic device 1620, thus no extra masks are required. Also the dummy structure 1570 may not have electrical conductivity. The length L2 of the dummy structure 1570 is in a range from about 0.1 μm to about 0.4 μm. The dummy structure 1570 will waste layout design margin, so the smaller length is better. Because of the fabrication limitation, the smallest length now is about 0.1 μm.

Figure 2:
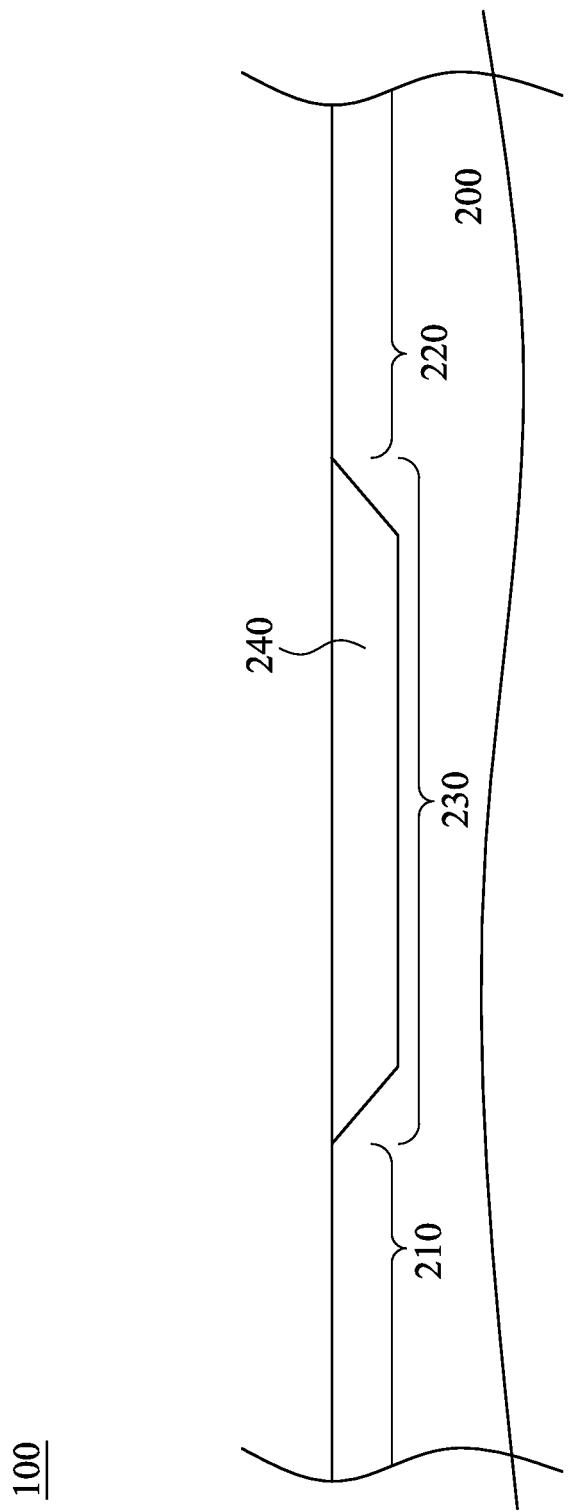
FIGS. 2-16 are cross-sectional views at various stages of manufacturing a semiconductor device according to various embodiments of the present disclosure.

FIGS. 2-16 are cross-sectional views at various stages of fabricating the semiconductor device 100 according to various embodiments of the present disclosure. Referring to FIG. 2, a substrate 200 is provided. The substrate 200 includes a semiconductor material like silicon, germanium, carbon, another semiconductor material as an III-V or II-VI material, or combinations thereof. The substrate 200 includes a shallow trench isolation (STI) region 240, dividing the substrate 200 into three regions including an active region 210, a dummy region 230, and an active region 220 which are sequentially adjacent to each other, and the region of the dummy region 230 is the same as the STI region 240. The STI region 240 is formed by conventional photolithographic and etching procedures, for example, reactive ion etching (RIE), followed by deposition method like low pressure chemical vapor deposition (LPCVD) or plasma enhanced chemical vapor deposition (PECVD) to fill the shallow trenches by materials includes silicon oxide, silicon nitride, silicon oxynitride, fluoride-doped silicate glass (FSG), low-k dielectric material, or combinations thereof.

Figure 3:
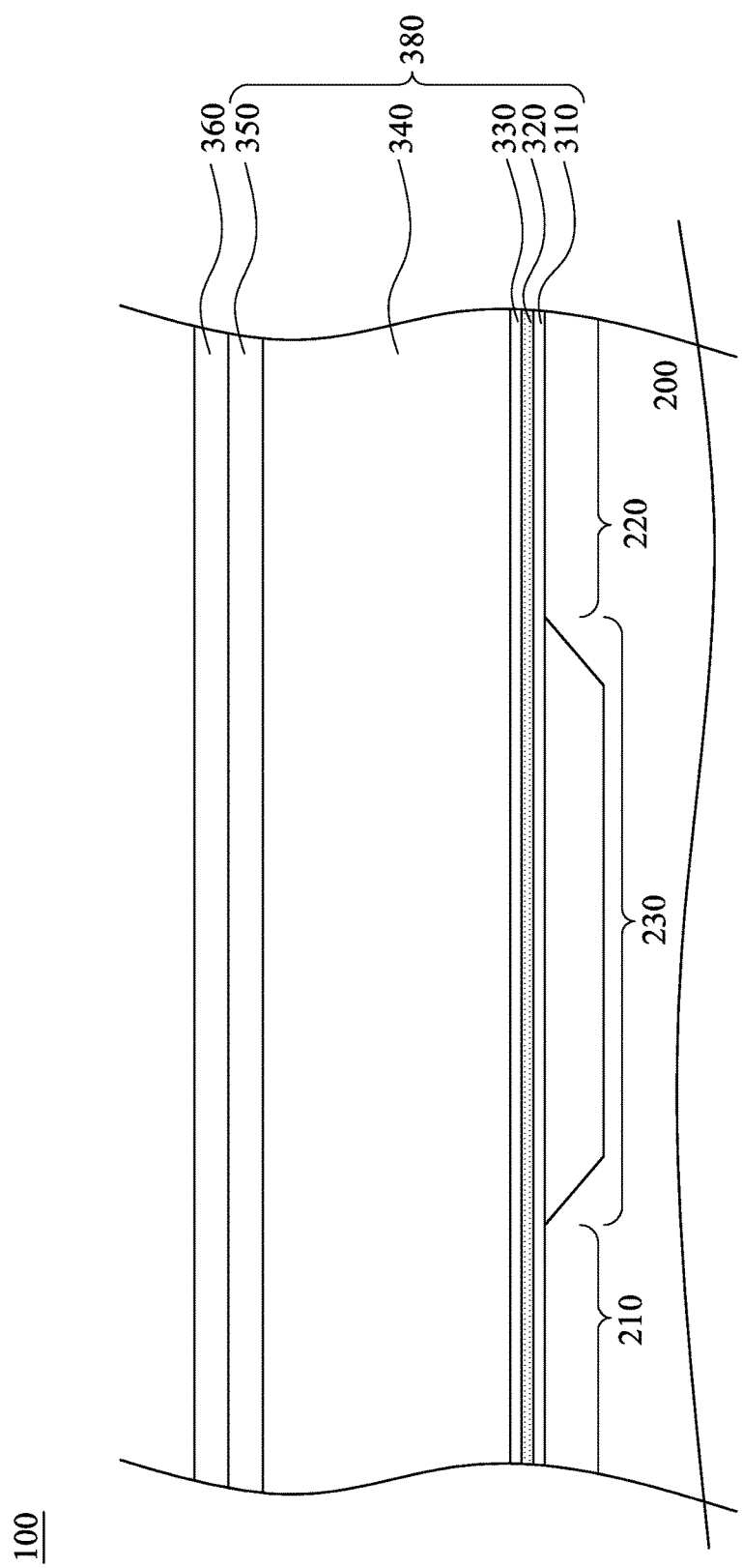

In FIG. 3, a high-k stack 380 including the high-k dielectric layer 320 and a dielectric layer 360 are deposited over the entire substrate 200 including the active region 210, the dummy region 230, and the active region 220. The part of the high-k stack 380 over the active region 220 may be formed as the logic device in the following operations. Part of the high-k dielectric layer 320 will last in the HKMG structure. It is much easier to deposit the high-k stack 380 over the entire substrate 200, followed by remove part of the high-k stack 380 than to deposit the high-k stack 380 over the formed memory device, than remove part of the high-k stack between the memory device and the logic device. The high-k stack 380 includes a intermediate layer 310 overlying the substrate 200, a high-k dielectric layer 320 overlying the intermediate layer 310, an etch stop layer 330 overlying the high-k dielectric layer 320, a conductive layer 340 overlying the etch stop layer 330, a protective layer 350 overlying the conductive layer 340. The dielectric layer 360 is disposed over the protective layer 350. The layers are disposed by deposition method including LPCVD, PECVD, atomic layer deposition (ALD), spin-on, sputtering or other suitable methods. In various embodiments of the present disclosure, the intermediate layer 310 includes silicon oxide, silicon oxynitride, or a low k material. The high-k dielectric layer 320 includes high-k materials as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The etch stop layer 330 includes Titanium nitride (TiN). The conductive layer 340 includes non-doped polysilicon. The protective layer 350 includes silicon nitride (SiN) as a hard mask. The dielectric layer 360 includes silicon oxide. In various embodiments of the present disclosure, the thickness of the intermediate layer 310 is in a range from 5 Å to about 20 Å, the high-k dielectric layer 320 is in a range from 5 Å to about 20 Å, the etch stop layer 330 is in a range from 10 Å to about 30 Å, the conductive layer 340 is in a range from 500 Å to about 1500 Å, the protective layer 350 is in a range from 50 Å to about 150 Å, and the dielectric layer 360 is in a range from 10 Å to about 50 Å. Part of the intermediate layer 310, high-k dielectric layer 320, etch stop layer 330 over the active region 220 may become part of the metal gate structure in the logic device. And the conductive layer 340 may be a dummy gate electrode, replaced by a metal layer in the following operation to form the logic device with HKMG structure.

Figure 4:
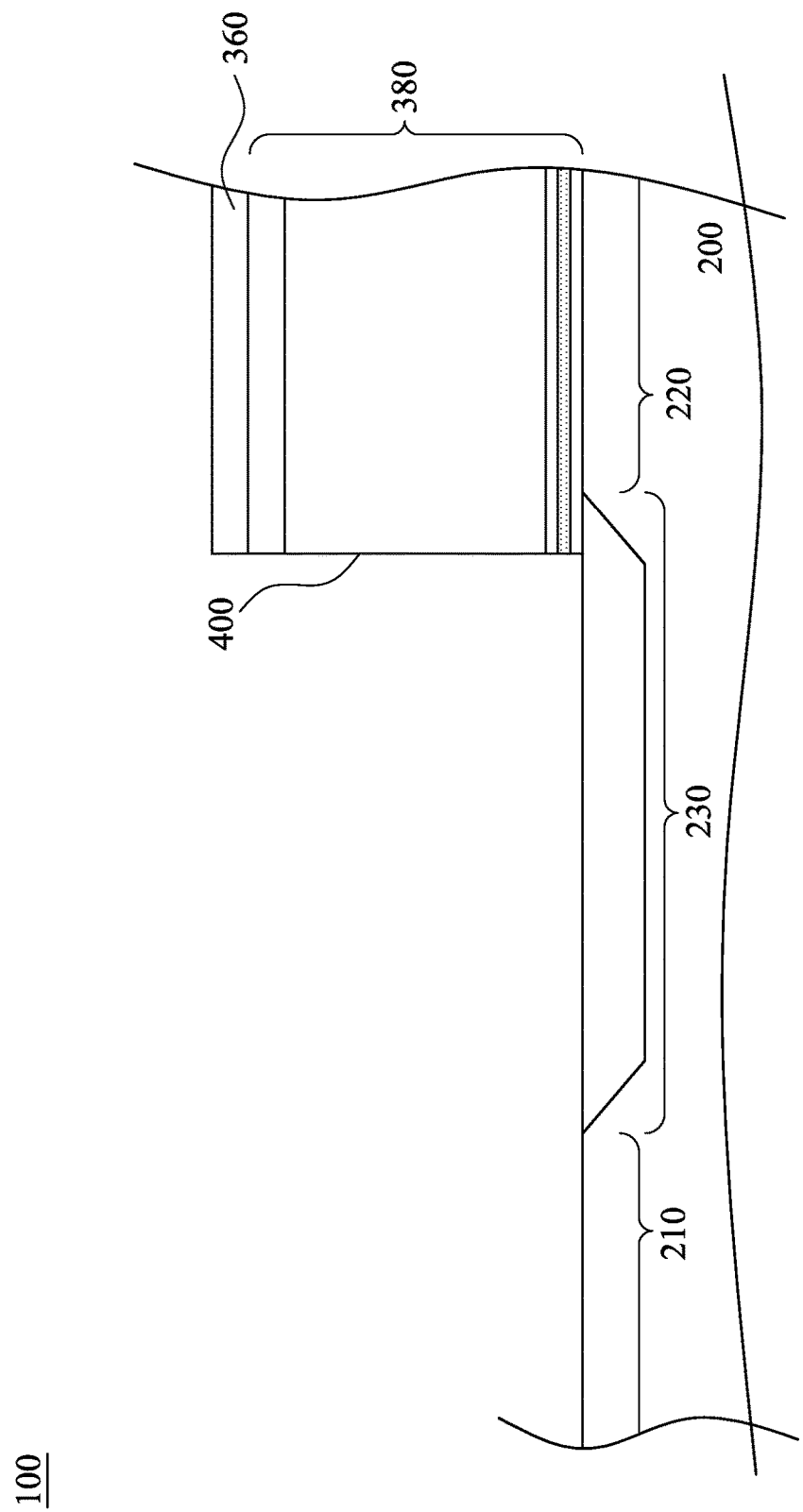

Referring to FIG. 4, the dielectric layer 360 and the high-k stack 380 over the active region 210 and the part of the dummy region 230 close to a boundary of the dummy region 230 and the active region 220 have been etched away, forming a sidewall 400 of the high-k stack 380 on the dummy region 230 close to a boundary of the dummy region 230 and the second active region 220. The high-k stack 380 covers the active region 220 for a logic device formation and a part of the dummy region 230 for the protective structure formation. The etching process can be dry or wet etching process. To use a blanket etching here is a simpler process in contrast with the process to etch the high-k stacks or the high-k dielectric layer 320 between the memory and logic devices without contaminating the devices.

Figure 5:
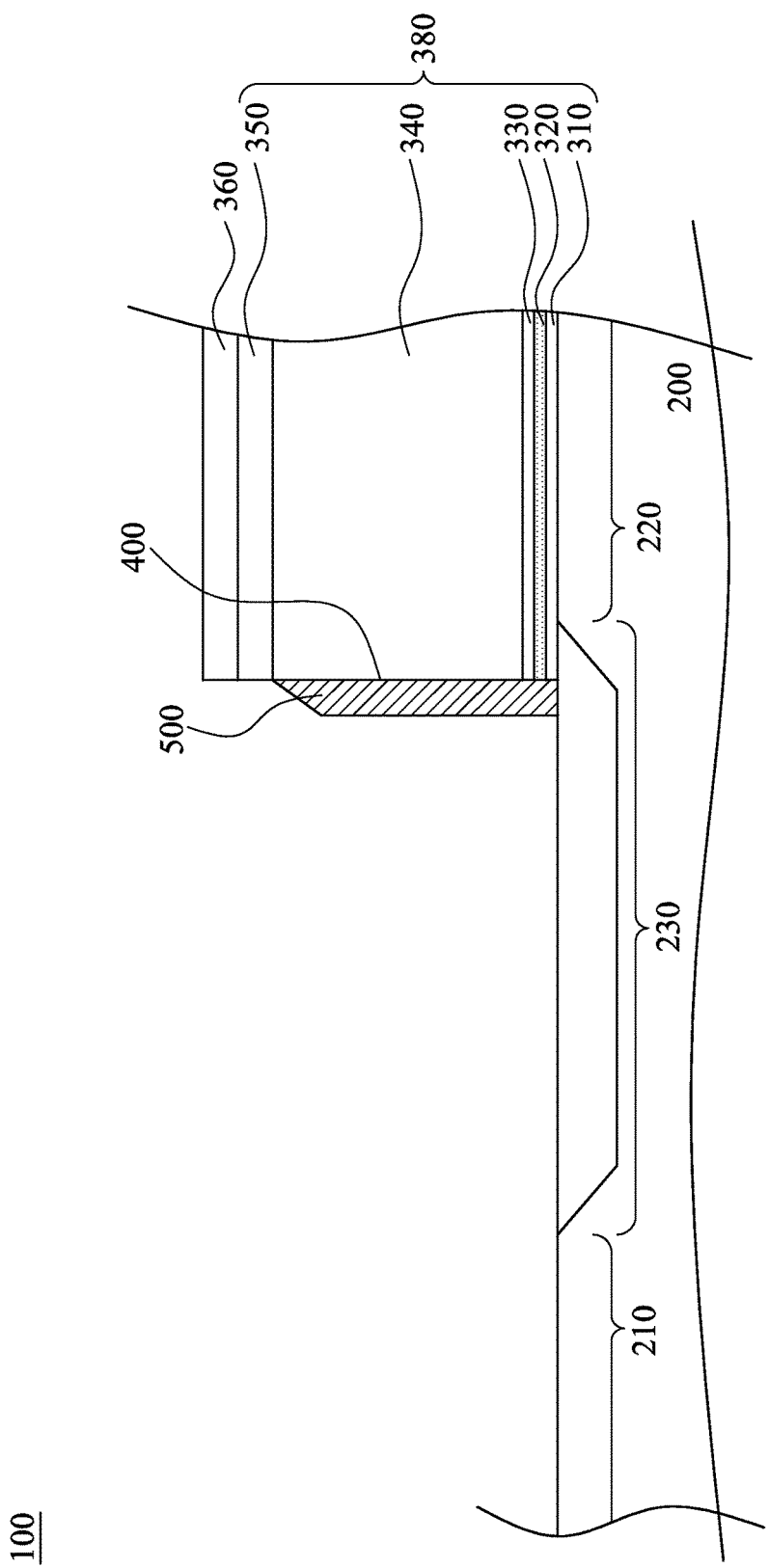

Referring to FIG. 5, a protective spacer 500 is formed next to the sidewall 400 of the high-k stack 380 over the dummy region 230. The width of the protective spacer 500 is in a range from about 5 nm to about 50 nm. The height of the protective spacer 500 is between the height of the protective layer 350 to the substrate 200 to seal and protect the conductive layer 340 and the high-k dielectric layer 320 not to be contaminated during the formation of the memory device. In various embodiments of the present disclosure, the height of protective spacer 500 is in a range from about 500 Å to about 1500 Å. The protective spacer 500 includes silicon nitride (SiN) and may be formed by depositing process, for example, ALD or LPCVD, and etching process. Because the process disclosed is the high-k dielectric layer forming before the formation of the memory device, the formed high-k dielectric layer 320 needs to be sealed by the protective spacer 500 to prevent contamination issue during the following operations. The protective spacer 500 will last in the semiconductor device 100, to become a part of a protective structure.

Figure 6:
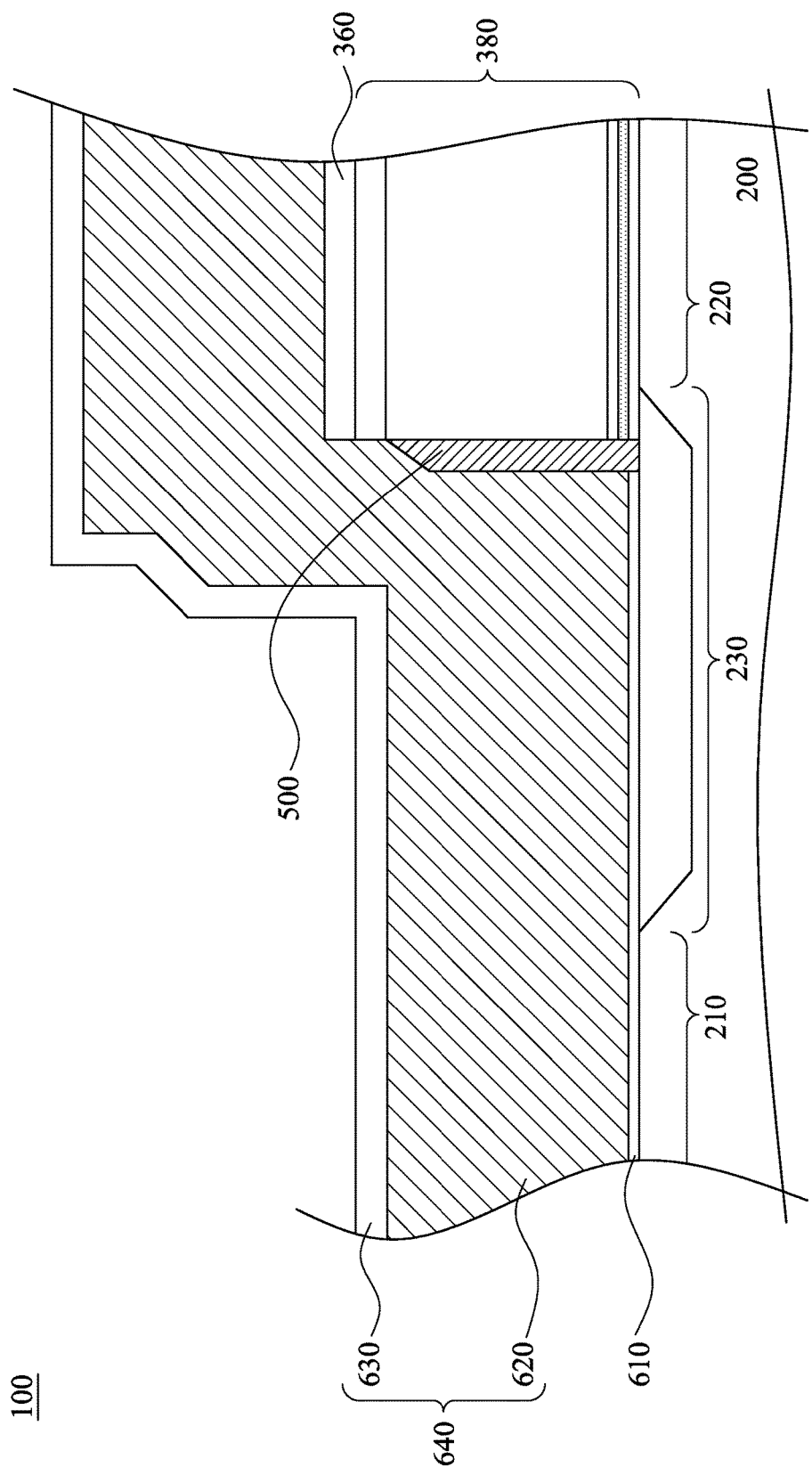

Referring to FIG. 6, an intermediate layer 610 is deposited on the substrate 200 and a conductive gate stack 640 is deposited over the intermediate layer 610 and the dielectric layer 360. The intermediate layer 610 includes silicon oxide, silicon oxynitride, or a low k material and is formed by in situ steam generation (ISSG) or other suitable deposition method. The conductive gate stack 640 includes a conductive layer 620 overlying the intermediate layer 610, and a protective layer 630 overlying the conductive layer 620. The conductive layer 620 and the protective layer 630 may be deposited by the previously described method like LPCVD. In various embodiments of the present disclosure, the conductive layer 620 includes doped polysilicon and the protective layer 630 includes silicon nitride as a hard mask. The conductive gate stack is formed to form the memory device. In various embodiments of the present disclosure, the thickness of the intermediate layer 610 is in a range from about 10 Å to about 50 Å, the conductive layer 620 is in a range from about 500 Å to about 1500 Å, and the protective layer 630 is in a range from about 200 Å to about 400 Å.

Figure 7:
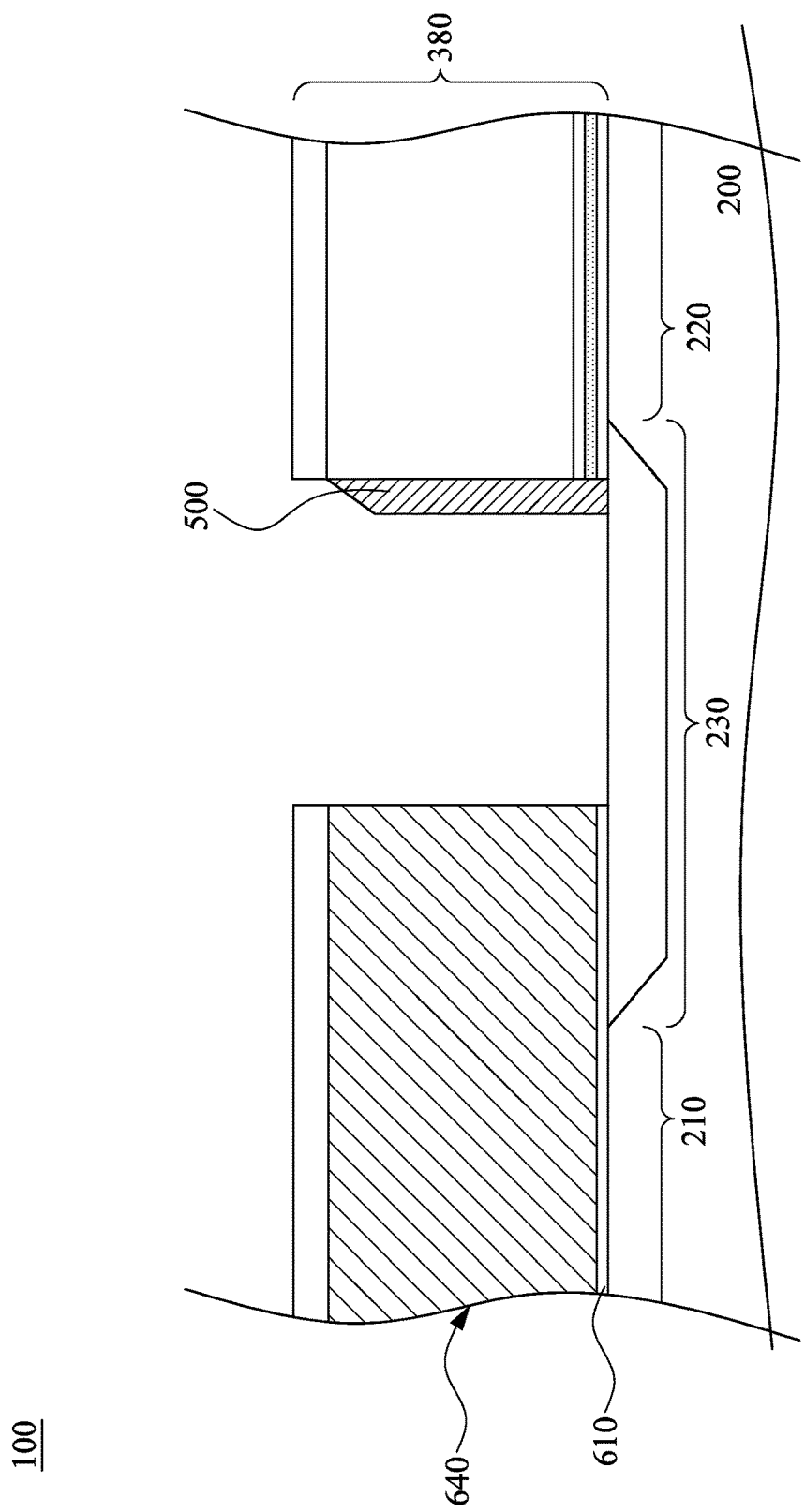

Referring to FIG. 7, the conductive gate stack 640 and the intermediate layer 610 on part of the dummy region 230 next to the protective spacer 500, and the conductive gate stack 640 and the dielectric layer 360 on the high-k stack 380 have been removed. Part of the conductive gate stack 640 and the intermediate layer 610 on the active region 210 are formed for forming the gate structure of the memory device. In various embodiments, the part of the conductive gate stack 640 and the intermediate layer 610 may be left on the dummy region 230 for forming the dummy structure. The high-k stack 380 covers the active region 220 in order to form the logic device and covers part of the dummy region 230 to form the protective structure. The removing process is an isotropic etching to etch out the conductive gate stack 640 and the intermediate layer 610 next to the protective spacer 500 to expose the substrate 200, and the conductive gate stack 640 and the dielectric layer 360 to decrease the height difference between the high-k stack 380 and the conductive gate stack 640. The isotropic etching includes wet etching, chemical dry etching (CDE), and other conventional isotropic etching way. In some embodiments of the present disclosure, the part of the conductive gate stack 640 and the intermediate layer 610 over the dummy region 230 may be completely removed. Thus no dummy structure will be formed in the following operations in comparison with the illustrated embodiments.

Figure 8:
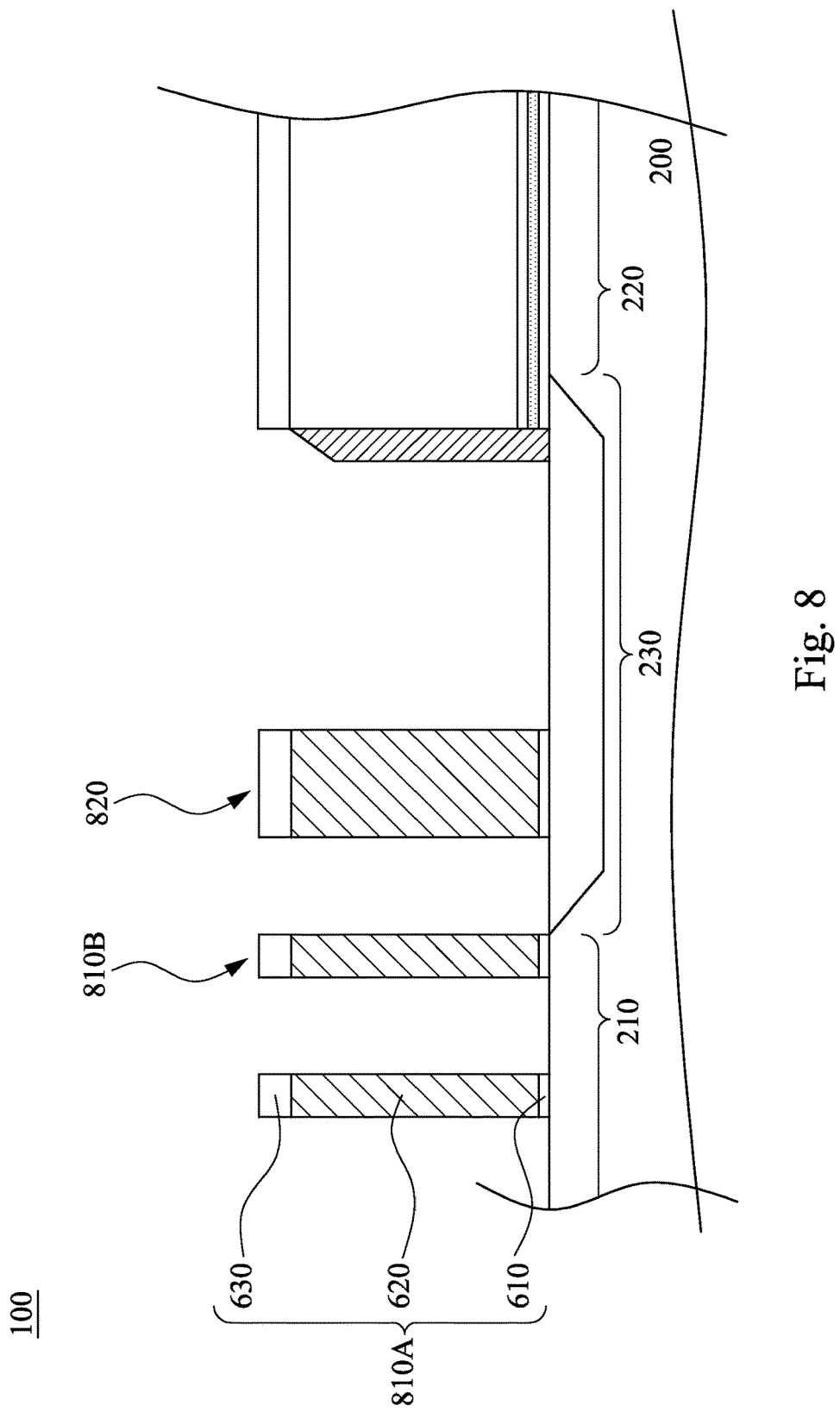

FIGS. 8-11 are cross-sectional views at various stages of forming the memory device on the active region 210, and show fabricating operations of forming the memory device on the active region 210. In various embodiments of the present disclosure, the memory device may include polysilicon gate electrode. In various embodiments, the memory device is a split-gate thin film flash memory. Referring to FIG. 8, in various embodiments of the present disclosure, a gate stack 810, which includes 810A, 810B are formed on the active region 210 and a gate stack 820 is formed on the dummy region 230. The gate stack 810B is formed at the boundary of the active region 210 and dummy region 230 on the active region 210. The process of forming the gate stack 810 on the active region 210 and the gate stack 820 on the dummy region 230 includes photolithography and etching as known in the art. The gate stack 820 may protect the dummy region 230 not be over etched in the following processes. The gate stacks 810A, 810B, 820 include the intermediate layer 610 on the substrate, the conductive layer 620 over the intermediate layer 610, and the protective layer 630 over the conductive layer 620.

Figure 9:
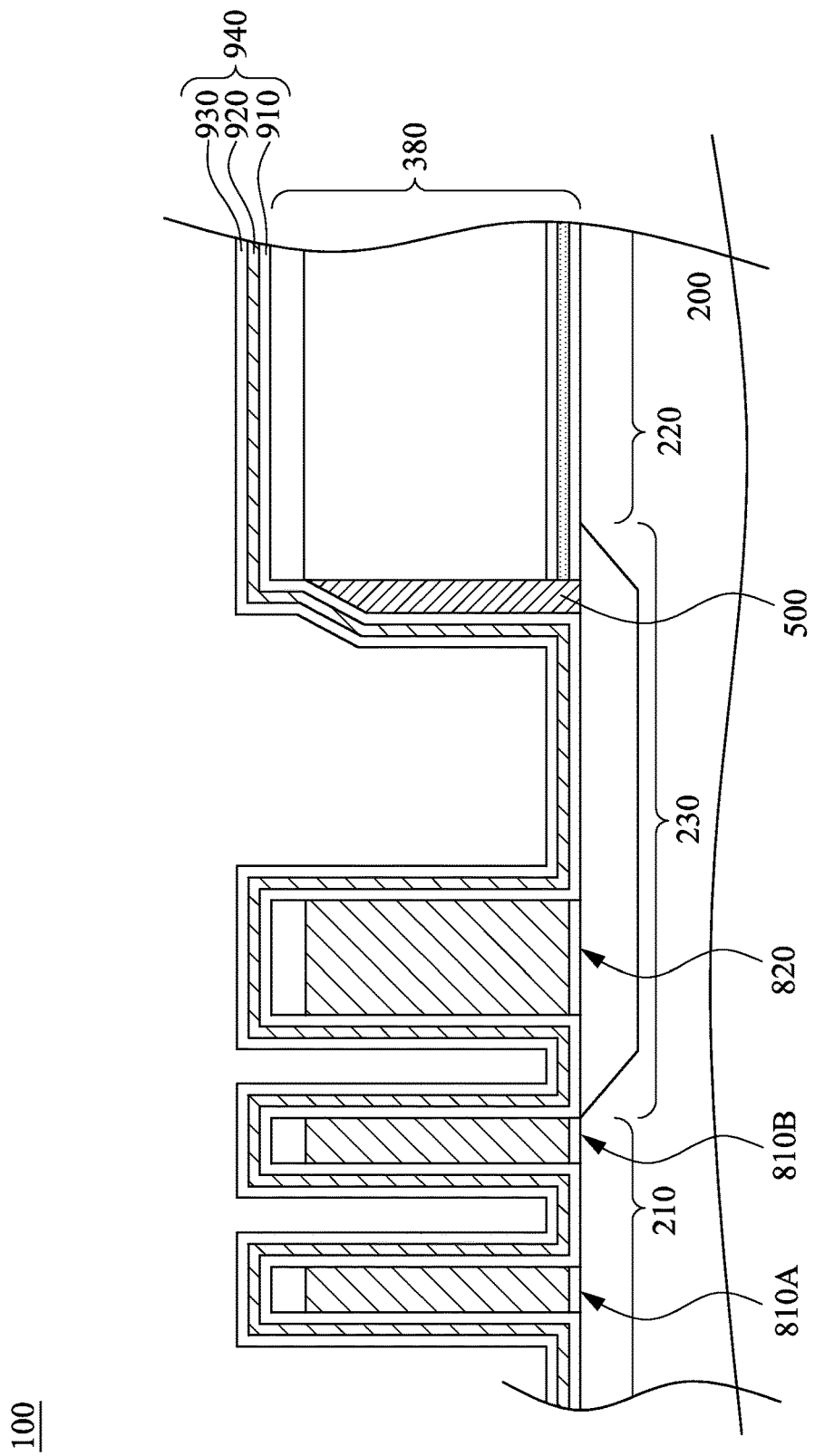

Referring to FIG. 9, a storage stack 940 is disposed over the gate stacks 810, 820, the high-k stack 380, the protective spacer 500, and the substrate 200. The storage stack 940 includes a storage layer 910 over the entire surface of the substrate 200, a conductive layer 920 over the storage layer 910, and depositing a protective layer 930 over the entire conductive layer 920. The storage layer 910 includes a nano dot storage layer and two oxide layers that sandwich the nano dot storage layer (the sandwich structure only represented as one storage layer 910 in the figure) for a split gate thin film structure. And the storage layer 910 may also includes an oxide nitride oxide (ONO) stack for NVM. In various embodiments of the present disclosure, the storage layer 910 includes silicon oxide and silicon nanocrystal dots, the conductive layer 920 includes doped polysilicon, and the protective layer 930 includes silicon nitride as a hard mask. The storage stack 940 may be deposit in a previously described way. In some embodiments, annealing process may be added in the depositing process. In various embodiments, the thickness of the storage layer 910 is in a range from about 100 Å to about 300 Å, the conductive layer 920 is in a range from about 200 Å to about 300 Å, and the protective layer 930 is in a range from about 200 Å to about 300 Å.

Figure 10:
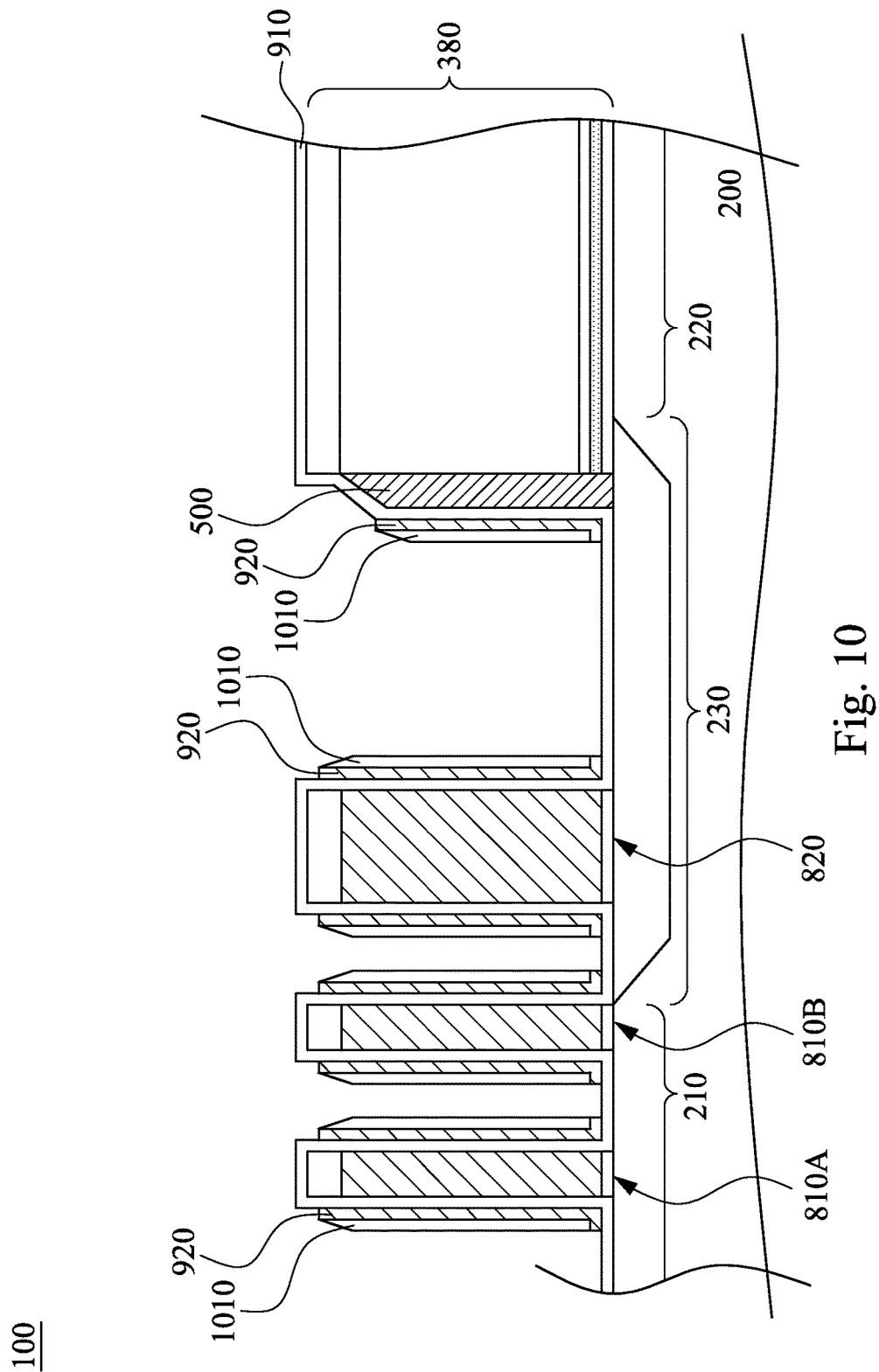

Referring to FIG. 10, a plurality of sidewall spacers 1010 are formed next to the stacks 810, 820, 380. The part of the storage stack 940, including part of the conductive layer 920 and the protective layer 930 on the surface of the substrate 200 and on the upper surface of the stacks 810, 820, 380, are etched to form the L-shaped conductive layer 920 and the sidewall spacers 1010 on the sidewalls of the stacks 810, 820, 380. The process of forming the sidewall spacers 1010 includes photolithography and etching as known in the art. In some embodiments of the present disclosure, a plurality of seal spacers (not illustrated in the figure) including silicon nitride are formed on the sidewall of the sidewall spacers 1010 by deposition and etching process to protect the conductive layer 920.

Figure 11:
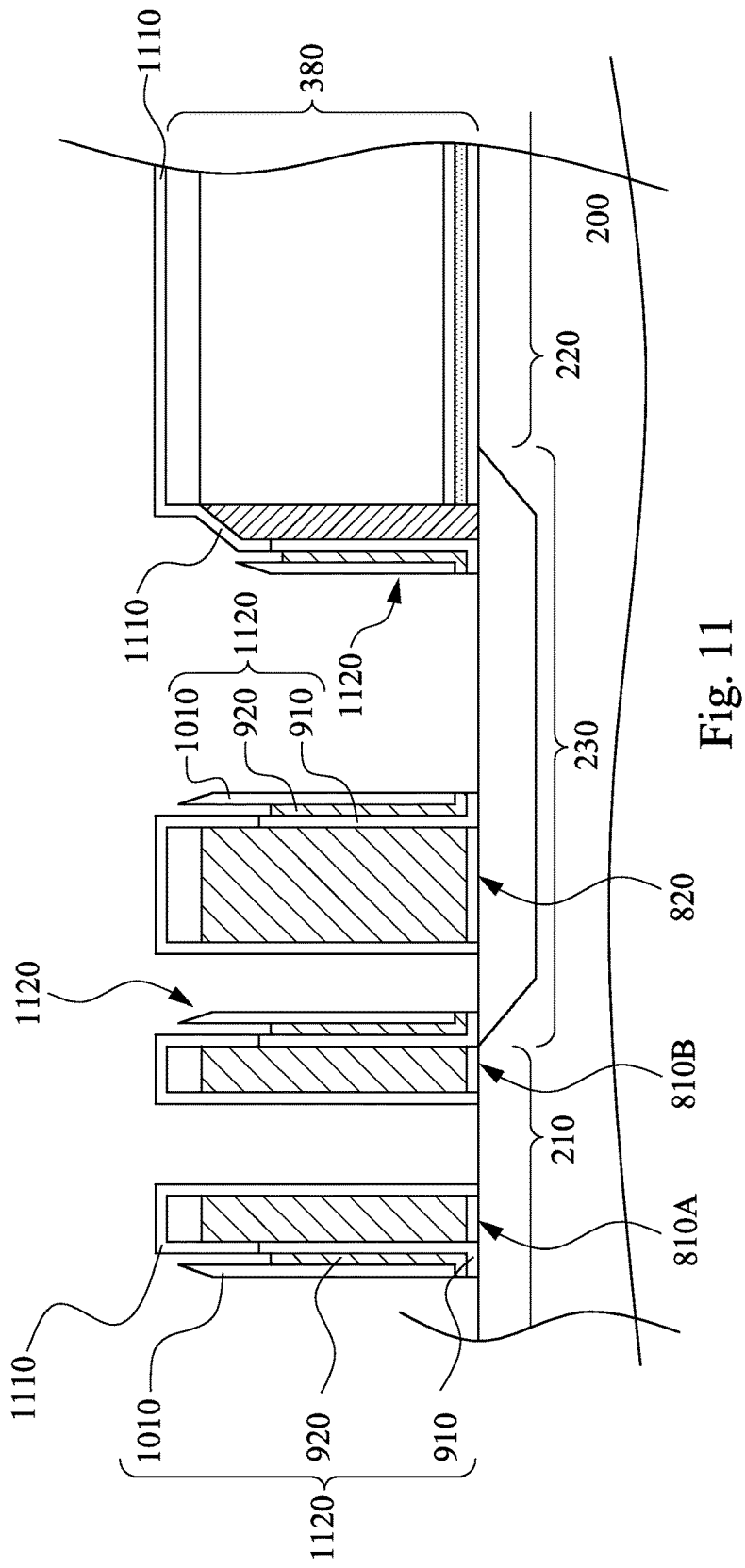

Referring to FIG. 11, according to various embodiments of the present disclosure, a plurality of storage stacks 1120 are formed next to one sidewall of the stacks 810, 820, 380. Part of the storage stack 940 is removed by operations include photolithography and etching to define the source/drain region. The storage stacks 1120 are formed and a dielectric layer 1110 is left after blanket etching the storage layer 910. The dielectric layer 1110 includes silicon oxide. The etching process may be wet etching, dry etching, CDE, reactive-ion etching (RIE), or combinations thereof. The storage stacks 1120 includes the storage layer 910 having a L-shape over the substrate 200 and next to one sidewall of the stacks 810, 820, 380, the conductive layer 920 having a L-shape over the storage layer 910, in which the conductive layer 920 is the control gate of the memory device, and the sidewall spacers 1010 overlying the conductive layer 920. The storage stacks 1120 may be formed on either sidewall of the stacks 810, 820, 380. The major structures of the thin film split gate memory device are formed in the operation. In some embodiments, the gate stack 820 may not be formed. In various embodiments of the present disclosure, the thin film split gate memory device may be other memory device, not limited to the depicted embodiment.

Figure 12:
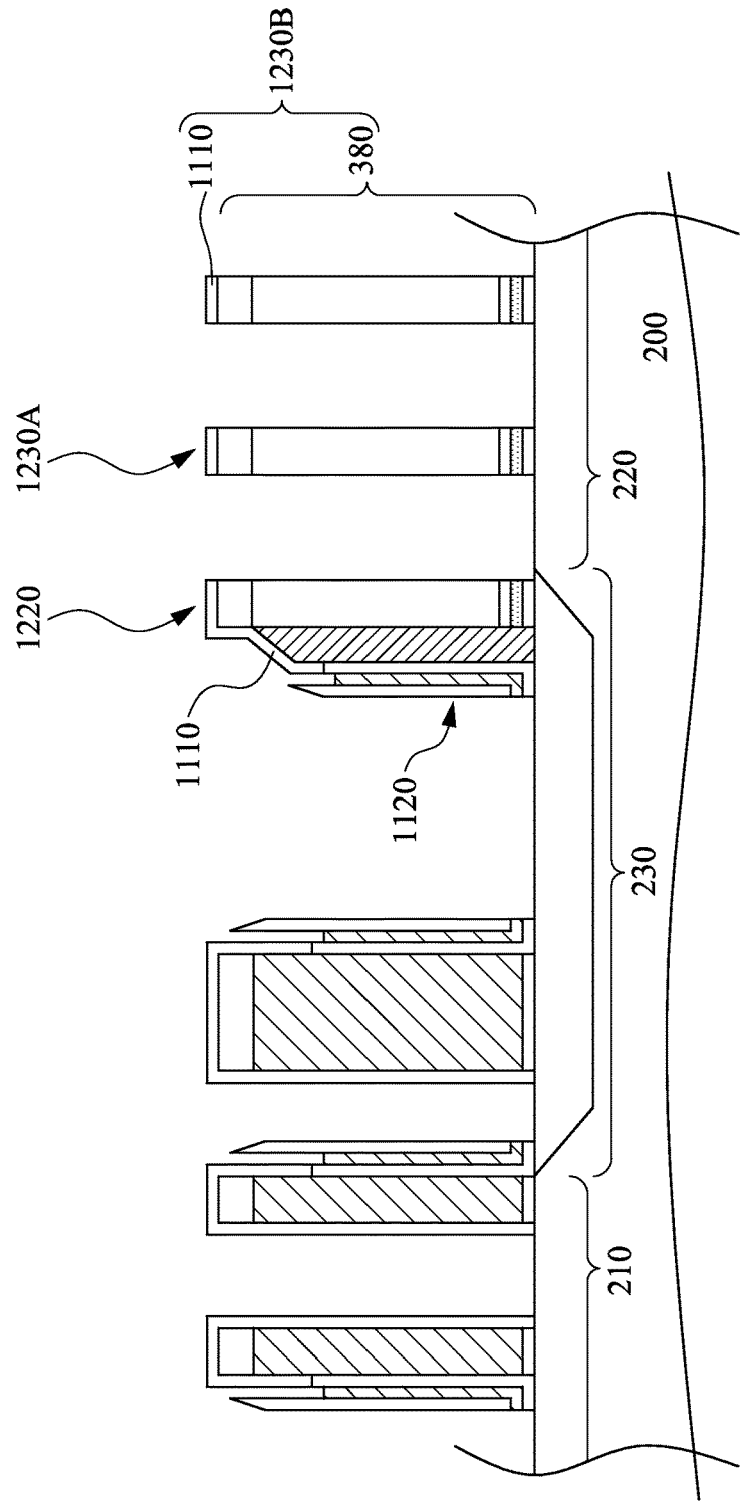

FIGS. 12-16 are cross-sectional views at various stages of forming a logic device on the active region 220, including fabricating operations for forming the logic device on the active region 220. In various embodiments of the present disclosure, the logic device may include high-k dielectric layer and metal gate. In various embodiments of the present disclosure, the logic device is CMOS. Referring to FIG. 12, according to various embodiments of the present disclosure, a gate stack 1230, which includes 1230A and 1230B, and a gate stack 1220 are formed by etching part of the high-k stack 380. Etching the high-k stack 380 to form the gate stack 1230 over the active region 220 on the substrate 200 and the gate stack 1220 over the dummy region 230 next to the active region 220 include photolithography and etching process as known in the art to etch part of the dielectric layer 1110 and the high-k stack 380 on the active region 220. The gate stack 1230 and the gate stack 1220 include the high-k stack 380 and the dielectric layer 1110 overlying the high-k stack 380.

Figure 13:
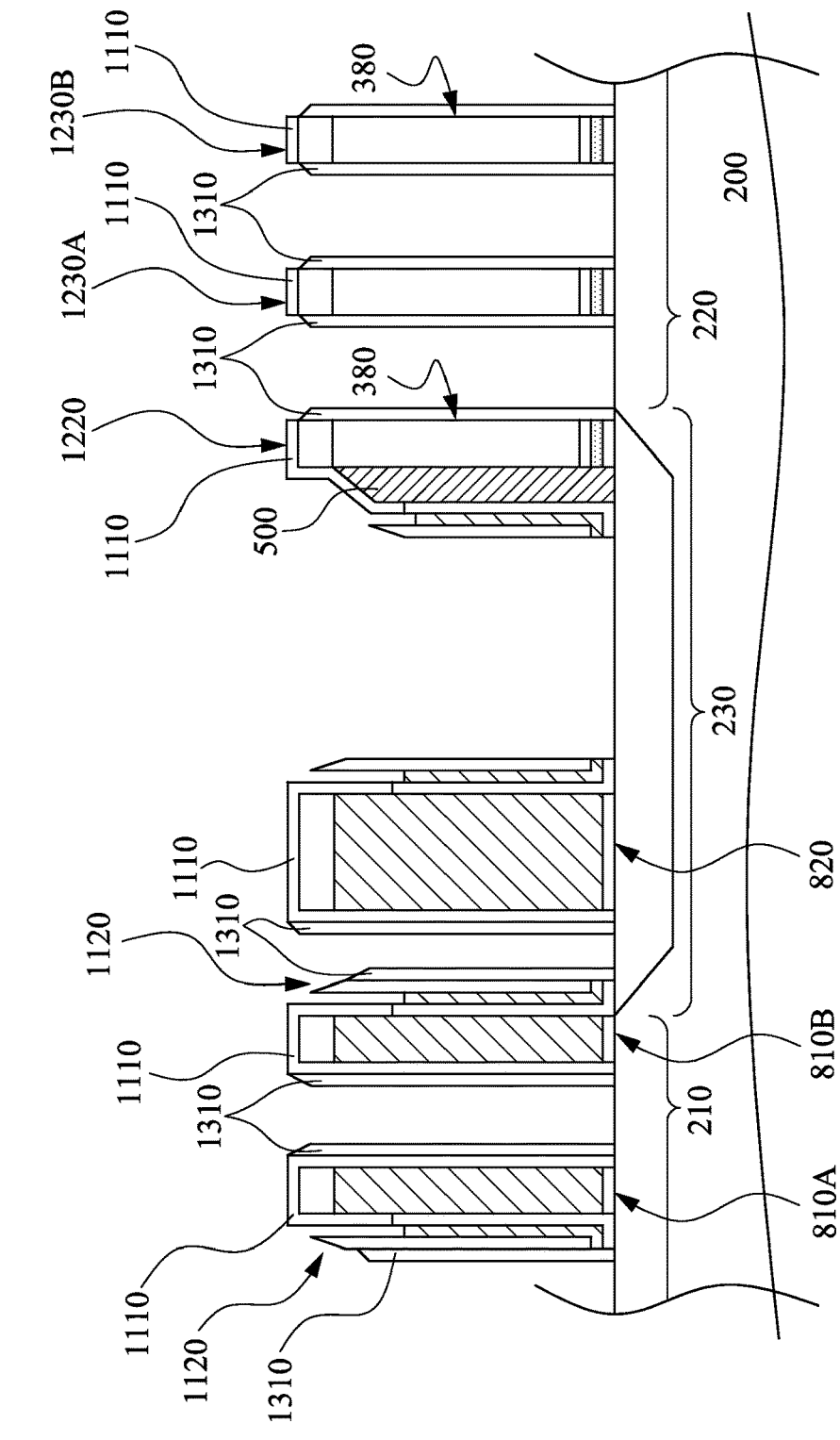

Referring to FIG. 13, a plurality of sidewall spacers 1310 are formed next to the gate stacks 810, 820, 1220, 1230 and the storage stacks 1120 on the substrate 200. The sidewall spacers 1310 include silicon nitride are formed by photolithography, deposition and etching process as previously described. The sidewall spacers 1310 are formed to protect the gate stacks and storage stacks in the following operations.

Figure 14:
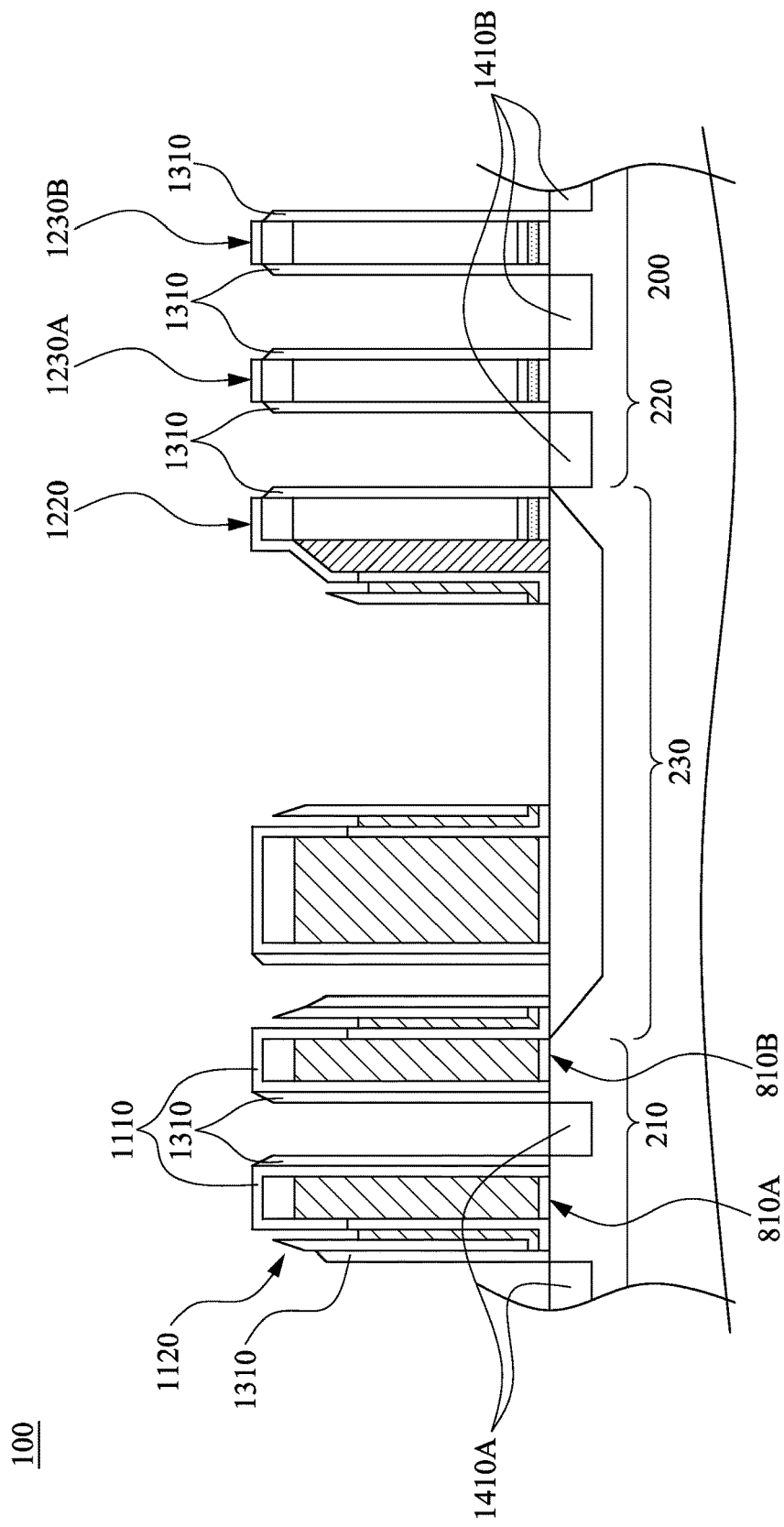

Referring to FIG. 14, a plurality of doped regions 1410, which includes 1410A and 1410B, are formed between the sidewall spacers 1310 on the active region 210 and active region 220 of the substrate 200. The doped regions 1410 are formed by ion implantation procedure, using arsenic or phosphorous ions for PFET, or boron or BF2 with NFET, followed by a rapid thermal anneal (RTA) or laser anneal (LSA) procedure to activate the source/drain dopants. In various embodiments of the present disclosure, a plurality of nickel silicide (NiSi) regions (not illustrated in the figure) are formed on the doped regions 1410.

Figure 15:
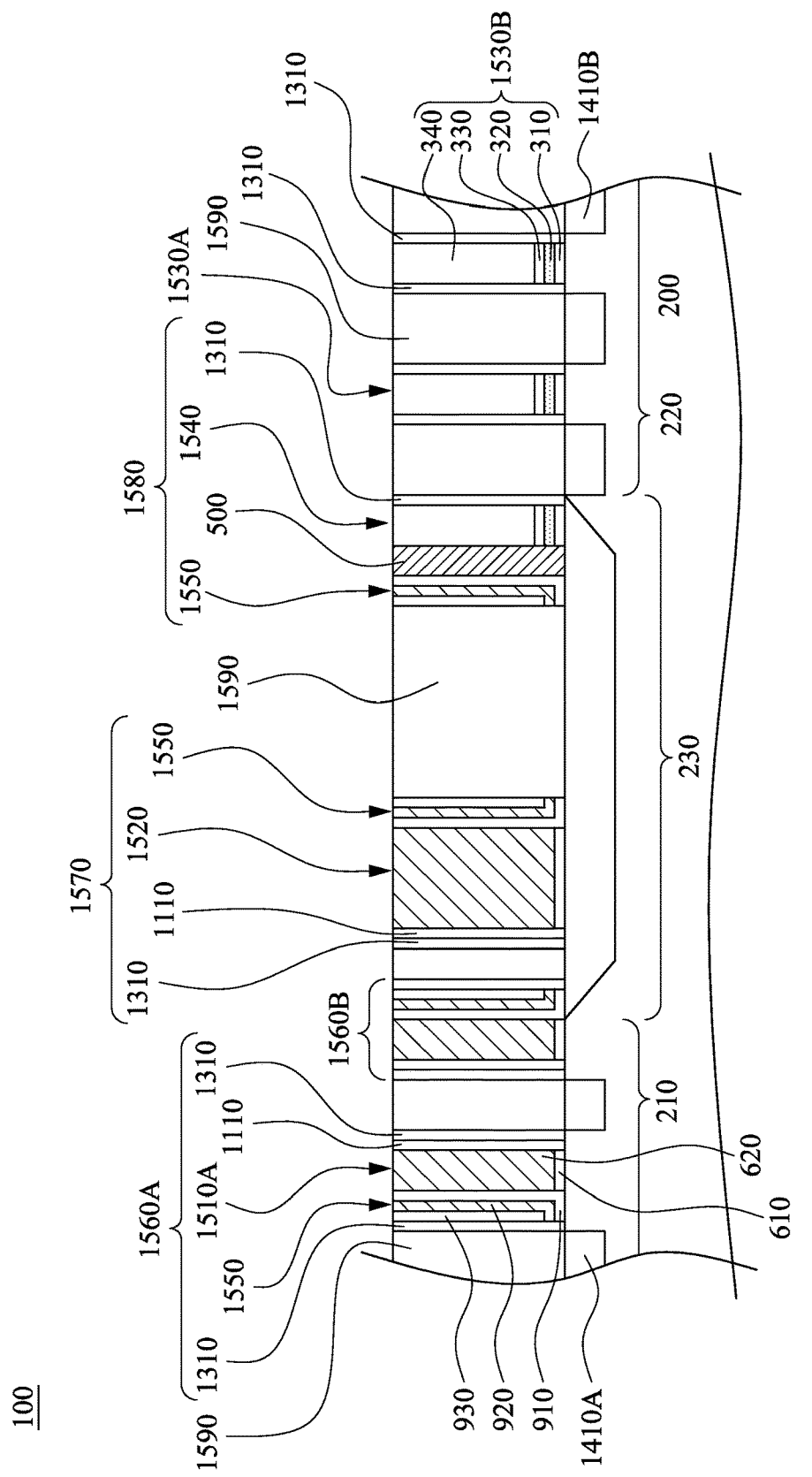

Referring to FIG. 15, according to various embodiments of the present disclosure, the semiconductor device 100 is planarized after an interlayer dielectric layer 1590 deposited over the substrate 200. The interlayer dielectric layer 1590 includes silicon oxide or borophosphosilicate glass (BPSG), and is formed by deposition method as LPCVD, PECVD or other suitable methods. In various embodiments of the present disclosure, an oxide layer (not illustrated in the figure) is deposited between the interlayer dielectric layer 1590 and the substrate 200 and between the interlayer dielectric layer 1590 and the sidewall spacers 1310. In various embodiments of present disclosure, a tensile SiN etch stop layer (not illustrated in the figure) is deposited before the deposition of the interlayer dielectric layer 1590. The upper surface of the semiconductor device 100 is planarized to expose the conductive layers 340, 620 in gate stacks by a chemical mechanical polishing (CMP) process. After the planarization of the semiconductor device 100, a memory device 1560, which includes 1560A and 1560B, are formed on the active region 210 of the substrate 200. A dummy structure 1570 and a protective structure 1580 are formed over the dummy region 230 of the substrate 200. And a gate structure 1530 on the active region 220 of the substrate 200 is formed.

The dummy structure 1570 includes a dummy gate stack 1520, a dielectric layer 1110 at one side of the dummy gate stack 1520, a storage structure 1550 at the other side of the dummy gate stack 1520, and the sidewall spacer 1310 next to the dielectric layer. The dummy gate stack 1520 includes the intermediate layer 610 and the conductive layer 620 over the intermediate layer 610. The storage structure 1550 is the storage stacks 1120 after the planarization. In some embodiments of the present disclosure, the dummy structure 1570 is not included in the semiconductor device 100.

The protective structure 1580 includes a dummy gate stack 1540 with the high-k dielectric layer 320 and the protective spacer 500 next to the dummy gate stack 1540. In various embodiments of the present disclosure, the protective structure 1580 further includes a storage structure 1550 next to the protective spacer 500, and a sidewall spacer 1310 next to the dummy gate stack 1540. The dummy gate stack 1540 is the gate stack 1220 after planarization, which includes the intermediate layer 310 over the substrate 200, the high-k dielectric layer 320 over the intermediate layer 310, the etch stop layer 330 over the high-k dielectric layer 320, and the conductive layer 340 over the etch stop layer 330.

The memory device 1560 includes a gate structure 1510, a storage structure 1550 next to the gate structure 1510, and the dielectric layer 1110 on the sidewall at the other side of the gate structure 1510, two sidewall spacers 1310 next to the storage structure 1550 and the dielectric layer 1110 separately. The gate structure 1510 includes the intermediate layer 610 over the substrate 200, and the conductive layer 620 over the intermediate layer 610.

The gate structure 1530 is the gate stack 1230 after planarization. The gate structure 1530 includes the intermediate layer 310 over the substrate 200, the high-k dielectric layer 320 over the intermediate layer 310, the etch stop layer 330 over the high-k dielectric layer 320, and the conductive layer 340 over the etch stop layer 330.

Figure 16:
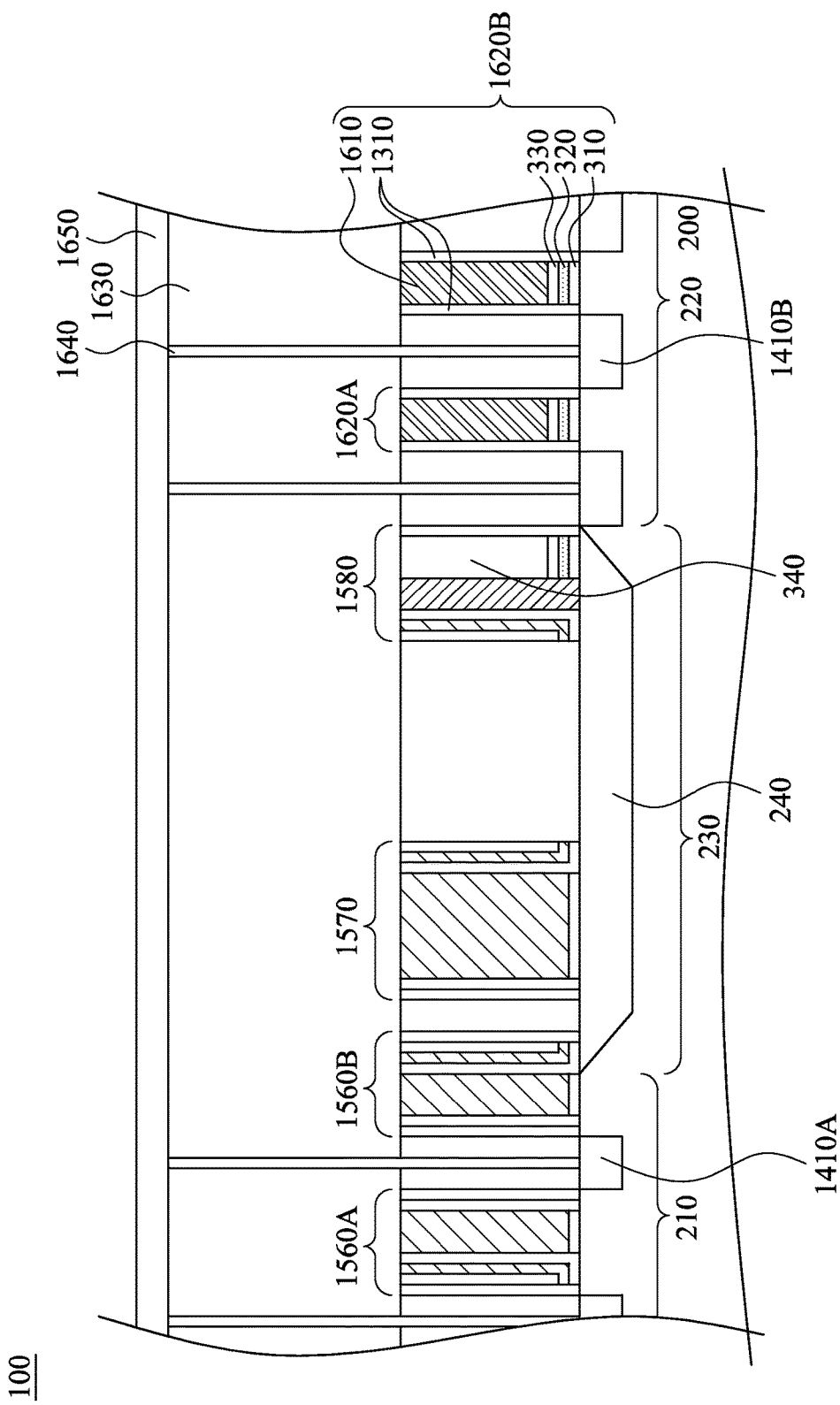

Referring to FIG. 16, FIG. 16 is a cross-sectional view of the semiconductor device 100 according to various embodiments of the present disclosure. A logic device 1620, which includes 1620A and 1620B, is formed by replacing the conductive layer 340 in the gate structure 1530 to a metal gate layer 1610. The replacing process includes photolithography, etching the conductive layer 340 in the gate structure 1530, depositing metal gate layer 1610, and metal CMP. The metal gate layer 1610 includes aluminum, tungsten or other suitable material. The logic device 1620 includes the intermediate layer 310 over the substrate 200, the high-k dielectric layer 320 over the intermediate layer 310, an etch stop layer 330 over the high-k dielectric layer 320, the metal gate layer 1610 over the etch stop layer 330, and two sidewall spacers 1310 on both sidewalls of the metal gate layer 1610.

After the formation of the logic device 1620, an interlayer dielectric layer 1630 is disposed over the semiconductor device 100. A plurality of contacts 1640 are formed through the interlayer dielectric layers 1630, 1590. And a metal layer 1650 is disposed over the interlayer dielectric layer 1640. The interlayer dielectric layer 1630 includes silicon oxide or borophosphosilicate glass (BPSG) and is formed by deposition method such as LPCVD, PECVD or other suitable methods. The contacts 1640 connect the doped regions 1410 to the metal layer 1650. The contacts 1640 are formed by etching the interlayer dielectric layers 1640,1590, and then depositing a contact material like tungsten, aluminum, cobalt or other suitable materials. The metal layer 1650 includes aluminum, tungsten or other suitable material, and is formed by deposition process such as LPCVD or PECVD or other suitable methods.

Figure 17:
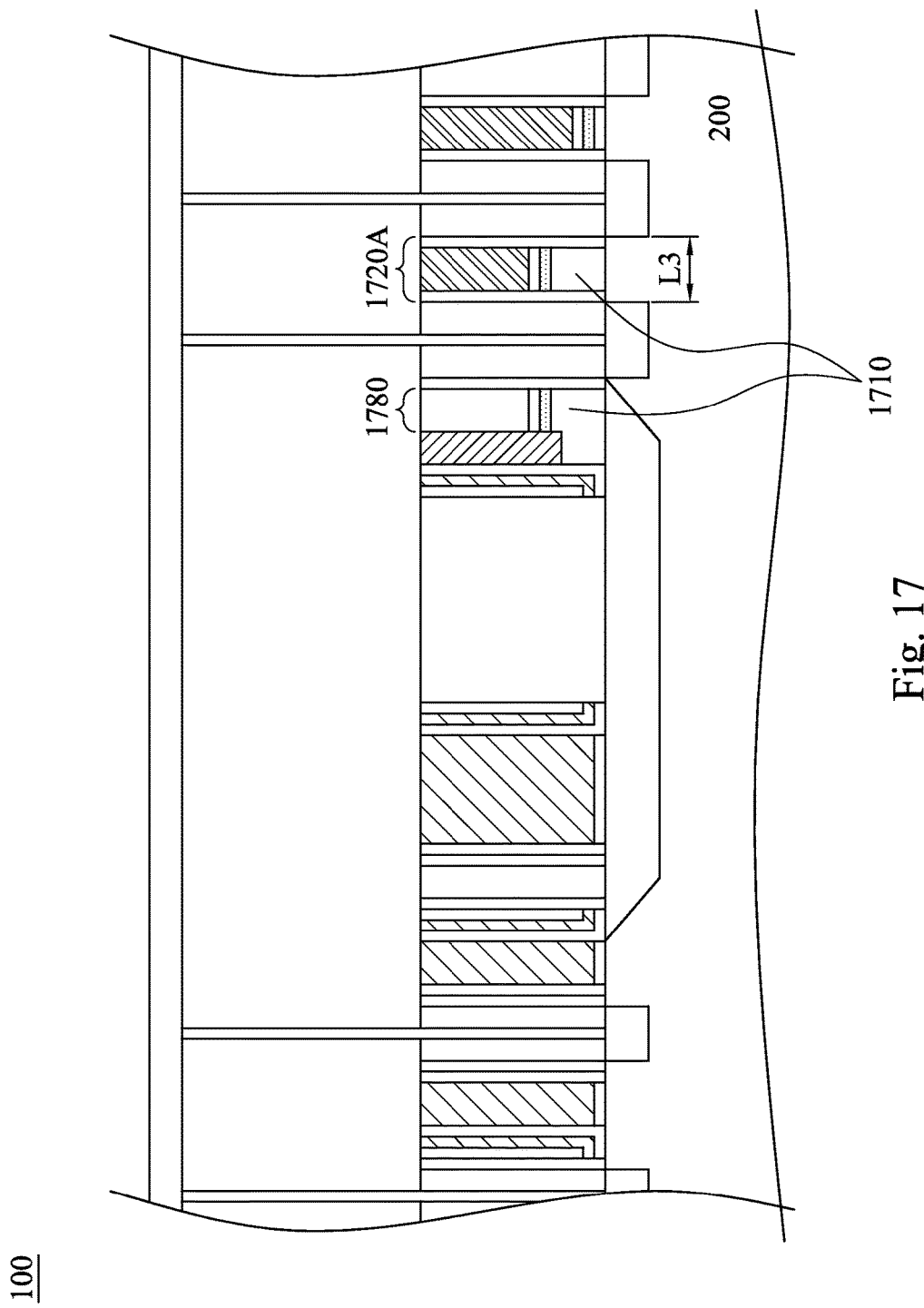
FIG. 17 is a cross-sectional view of a semiconductor device according to various embodiments of the present disclosure.

Referring to FIG. 17, FIG. 17 is a cross-sectional view of a semiconductor device 100 according to various embodiments of the present disclosure. The difference between the semiconductor device 100 illustrated in FIG. 16 is that the intermediate layer 310 in the semiconductor structure 1620A and in the protective structure 1580 in FIG. 16 is changed for a high voltage oxide layer 1710 includes silicon oxide to form a high-k metal gate structure 1720A and a dummy gate stack 1780. In various embodiments of the present disclosure, the thickness of the high voltage oxide layer is in a range from about 100 Å to about 300 Å, the gate length L3 of the high-k metal gate structure 1720A is in a range from about 0.5 μm to about 2 μm, and the gate width (not shown in the figure) of the high-k metal gate structure 1720A is in a range from about 1 μm to about 0.5 μm. The high-k metal gate structure 1720A with high voltage oxide layer 1710 may be a PMOS, NMOS, or COMS.

In various embodiments of the present disclosure, referring to FIG. 16, the semiconductor device 100 is not limited to form the memory device 1560 on the active region 210 and the logic device 1620 on the active region 220. The protective structure 1580 may separate semiconductor structures having poly silicon gate structure without high-k dielectric layer on the active region 210 with semiconductor structures having HKMG structure on the active region 220. In various embodiments of the present disclosure, other semiconductor structures such as lens, sensors, amplifiers, oscillators, and light emitting diode may also be formed in the active region 210.

The present disclosure includes the mechanism of fabricating the semiconductor device according to various embodiments of the present disclosure. In various embodiments of the present disclosure, the fabricating method is referred to as a high-k dielectric layer first, and logic device last process. The "first" means the high-k dielectric layer used in the logic device is deposited before the formation of the memory device and the logic device. And the "last" means the logic device is formed after the formation of the memory device. Because the method is a high-k dielectric layer first process, it may reduce two masks for separating the memory and logic device during the fabrication, and have no contamination problem from the above mentioned two masks. In order to make the high-k dielectric layer first, logic device last process available, the protective spacer is added to protect the high-k stack including the high-k dielectric layer, and to separate the logic device and the memory device. Therefore, the semiconductor device fabricating by the method will have one protective structure next to the logic device. The protective structure includes the protective spacer and the conductive layer without doped polysilicon. In various embodiments of the present disclosure, the semiconductor device also includes the dummy structure neighboring the protective structure, which includes a dummy gate stack including a doped polysilicon conductive layer, which may protect the STI region not be over etched. In various embodiments of the present disclosure, the method may form embedded split gate thin film flash memory device with logic device including HKMG structure for system on chip application. In various embodiments of the present disclosure, the HKMG structure in the logic device including a high-voltage oxide layer, wherein the thickness of the high-voltage oxide layer is in a range from about 100 Å to about 300 Å.

In various embodiments of the present disclosure, the semiconductor device includes the protective structure on the substrate, and two different semiconductor structures, for example, memory device and logic device, separated by the protective structure. The substrate has two active regions divided by the shallow trench isolation (STI) region. The protective structure on the STI region at the boundary of the active region including semiconductor structures with high-k dielectric layer includes the dummy gate stack with the high-k dielectric layer and the protective spacer next to the dummy gate stack. In various embodiments of the present disclosure, the semiconductor device also includes the dummy structure on the STI region. In various embodiments of the present disclosure, the two different semiconductor structures may be memory device and logic device. The memory device may be a volatile memory including DRAM, SRAM, or a non-volatile memory including ROM and flash memory, or combinations thereof. And the logic device may include PFET, NFET, BJT, MOSFET, which includes PMOS, NMOS, COMS, or combinations thereof. In various embodiments of the present disclosure, the two different semiconductor structures may be semiconductor structures with high-k dielectric layer and semiconductor structures without high-k dielectric layer.

In various embodiments of the present disclosure, a method for fabricating the semiconductor device is provided, which includes the following operations. A substrate with a first active region, a dummy region, and a second active region that are sequentially adjacent to each other is provided. A high-k stack and a first dielectric layer are deposited over the substrate. The first dielectric layer and the high-k stack over the first active region and part of the dummy region of the substrate is removed to form a sidewall of the high-k stack on the dummy region next to a boundary of the dummy region and the second active region. A protective spacer is formed next to the sidewall of the high-k stack over the dummy region. A first intermediate layer is deposited on the substrate surface and a conductive gate stack is deposited over the first intermediate layer and the first dielectric layer. The conductive gate stack and the first intermediate layer on part of the dummy region next to the protective spacer, and the conductive gate stack and the first dielectric layer on the high-k stack are removed. A first semiconductor structure is formed on the first active region. Further, a second semiconductor structure is formed on the second active region.

In various embodiments of the present disclosure, the semiconductor device includes a substrate having a first active region and a second active region divided by a shallow trench isolation (STI) region; a protective structure formed over the STI region at the boundary of the second active region of the substrate, comprising a first dummy gate stack with a high-k dielectric layer and a protective spacer next to the first dummy gate stack; a first semiconductor structure formed over the first active region of the substrate, comprising a first gate structure with a first intermediate layer and a second conductive layer over the first intermediate layer; and a second semiconductor structure formed over the second active region of the substrate, comprising a high-k dielectric layer and a metal gate layer over the high-k dielectric layer.

In various embodiments of the present disclosure, a semiconductor device includes a substrate having a first active region and a second active region divided by a shallow trench isolation (STI) region; a protective structure formed over the STI region neighboring the second active region of the substrate comprising a first dummy gate stack with a high-k dielectric layer and a protective spacer next to the first dummy gate stack; a dummy structure with a second dummy gate stack formed over the STI region of the substrate; a memory device on the first active region of the substrate; and a logic device on the second active region of the substrate.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A semiconductor device comprising:
a substrate having a first active region and a second active region divided by a shallow trench isolation (STI) region;
a protective structure formed over the STI region at the boundary of the second active region of the substrate, comprising a first dummy gate stack, a first conductive layer, a storage layer present between the first conductive layer and the first dummy gate stack, and a protective spacer present between the first conductive layer and the first dummy gate stack, wherein the first dummy gate stack comprises a first gate dielectric layer in contact with the STI region and a second conductive layer over the first gate dielectric layer and wherein the protective spacer is in contact with the STI region and abuts the second conductive layer;
a first semiconductor structure formed over the first active region of the substrate, comprising a first gate structure with a second gate dielectric layer and a third conductive layer over the second gate dielectric layer, wherein the first semiconductor structure is free of high-k dielectric layer; and
a second semiconductor structure formed over the second active region of the substrate, comprising a high-k dielectric layer and a metal gate layer over the high-k dielectric layer, wherein the protective structure is present between the first semiconductor structure and the second semiconductor structure, wherein the first semiconductor structure has less number of gate dielec- tric layers than at least one of the protective structure and the second semiconductor structure.

2. The device of claim 1, wherein the protective structure further comprises:
a sidewall spacer next to the first dummy gate stack.

3. The device of claim 1, further comprising:
a dummy structure formed over the STI region neighboring the first semiconductor structure, comprising:
a second dummy gate stack;
a storage structure next to the second dummy gate stack;
a dielectric layer next to the other side of the second dummy gate stack; and
a sidewall spacer next to the dielectric layer.

4. The device of claim 3, wherein the protective structure comprising the first dummy gate stack, the first conductive layer, the storage layer, and the protective spacer has a width in a range from about 0.1 μm to about 0.4 μm, and the dummy structure comprising the second dummy gate stack, the storage structure, the dielectric layer, and the sidewall spacer has a width in a range from about 0.1 μm to about 0.4 μm.

5. The device of claim 1, wherein the first semiconductor structure comprises memory structures, lens, sensors, amplifiers, oscillators, light emitting diode or combinations thereof.

6. The device of claim 1, wherein the second semiconductor structure comprises a p-type metal oxide semiconductor (PMOS), an n-type metal oxide semiconductor (NMOS), a complementary metal-oxide-semiconductor (CMOS), or combinations thereof.

7. The semiconductor device of claim 1, further comprising an etch stop layer between the first gate dielectric layer and the second conductive layer of the first dummy gate stack and between the high-k dielectric layer and the metal gate layer of the second semiconductor structure.

8. A semiconductor device comprising:
a substrate having a first active region and a second active region divided by a shallow trench isolation (STI) region;
a protective structure formed over the STI region neighboring the second active region of the substrate, the protective structure comprising a first dummy gate stack;
a first storage structure formed on a sidewall of the first dummy gate stack, the first storage structure including a protective layer, a first conductive layer between the protective layer and the first dummy gate stack, and a storage layer present between the first conductive layer and the first dummy gate stack, the protective structure further comprising a protective spacer present between the storage layer and the first dummy gate stack, wherein the first dummy gate stack comprises an intermediate dielectric layer, a first high-k dielectric layer over the intermediate dielectric layer, and a second conductive layer capping the first high-k dielectric layer, and wherein the intermediate dielectric layer is in contact with the STI region, and the protective spacer is in contact with the second conductive layer;
a dummy structure with a second dummy gate stack formed over the STI region of the substrate;
a second storage structure formed on a sidewall of the second dummy gate stack and including a third conductive layer;
a memory device on the first active region of the substrate; and
a logic device on the second active region of the substrate, wherein the logic device, the protective structure, and the memory device at least partially laterally overlap with each other where the protective structure is present between the memory device and the logic device, wherein the second dummy gate stack has less number of gate dielectric layers than at least one of the first dummy gate stack and the logic device.

9. The semiconductor device of claim 8, wherein the memory device comprises a thin film split-gate flash memory.

10. The semiconductor device of claim 8, wherein the logic device comprises a second high-k dielectric layer and a metal gate over the second high-k dielectric layer.

11. The semiconductor device of claim 8, wherein the protective structure further comprises:
a sidewall spacer next to the first dummy gate stack.

12. The semiconductor device of claim 8, wherein the dummy structure comprises:
a dielectric layer next to the second dummy gate stack; and
a sidewall spacer next to the dielectric layer, wherein the dielectric layer is between the sidewall spacer and the second dummy gate stack.

13. The semiconductor device of claim 8, further comprising a dielectric layer formed on another sidewall of the second dummy gate stack opposite to the sidewall on which the second storage structure is formed, wherein the first dummy gate stack is free of the dielectric layer.

14. A semiconductor device comprising:
a substrate having a first active region and a second active region divided by a shallow trench isolation (STI) region;
a protective structure formed over the STI region and in close proximity to the second active region and comprising a first dummy gate stack;
a first storage structure formed on a sidewall of the first dummy gate stack, the first storage structure comprising a protective layer, a storage layer, and a first conductive layer between the storage layer and the protective layer, the protective structure further comprising a protective spacer present on the sidewall of the first dummy gate stack, wherein the storage layer is in contact with the first conductive layer, and the first dummy gate stack comprises an intermediate dielectric layer, a second conductive layer, and a high-k dielectric layer between the second conductive layer and the intermediate dielectric layer, and wherein the intermediate dielectric layer is in contact with the STI region, and the protective spacer is in contact with the second conductive layer;
a memory device formed over the first active region of the substrate and comprising a gate structure;
a second storage structure formed on a sidewall of the gate structure of the memory device and in contact with the STI region; and
a logic device formed over the second active region of the substrate, comprising a high-k dielectric layer and a metal gate layer over the high-k dielectric layer, wherein the logic device, the protective spacer on the sidewall of the first dummy gate stack, and the memory device at least partially laterally overlap with each other where the protective spacer on the sidewall of the first dummy gate stack is present between the memory device and the logic device, wherein the memory device has less number of gate dielectric layers than the protective structure.

15. The device of claim 14, wherein the protective structure further comprises:
a sidewall spacer next to the first dummy gate stack.

16. The device of claim 14, further comprising:
a dummy structure formed over the STI region neighboring the memory device, comprising:
a second dummy gate stack;
a third storage structure next to the second dummy gate stack;
a dielectric layer next to the second dummy gate stack, wherein the second dummy gate stack is between the dielectric layer and the third storage structure; and
a sidewall spacer next to the dielectric layer.

17. The device of claim 16, wherein the protective structure is spaced apart from the dummy structure.

18. The device of claim 14, wherein the storage layer is present between the first conductive layer and the first dummy gate stack.

19. The device of claim 14, wherein the logic device comprises a p-type metal oxide semiconductor (PMOS), an n-type metal oxide semiconductor (NMOS), a complementary metal-oxide-semiconductor (CMOS), or combinations thereof.

20. The semiconductor device of claim 14, wherein the memory device and the logic device are free of the protective spacer.

* * * * *